United States Patent
Chou (10) Patent No.: US 7,114,938 B2
(45) Date of Patent: Oct. 3, 2006

(54) LITHOGRAPHIC APPARATUS FOR MOLDING ULTRAFINE FEATURES

(75) Inventor: Stephen Y. Chou, Golden Valley, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 8 days.

(21) Appl. No.: 10/351,770

(22) Filed: Jan. 27, 2003

(65) Prior Publication Data

US 2006/0127522 A1   Jun. 15, 2006

Related U.S. Application Data (60) Continuation of application No. 10/046,594, filed on Oct. 29, 2001, which is a division of application No. 09/107,006, filed on Jun. 30, 1998, now Pat. No. 6,309,580, which is a continuation of application No. 08/558,809, filed on Nov. 15, 1995, now Pat. No. 5,772,905.

(51) Int. Cl.
B29C 43/58 (2006.01)
H01L 21/304 (2006.01)

(52) U.S. Cl. ............. 425/126.1; 425/150; 425/397; 425/400; 425/407

(58) Field of Classification Search ............. 425/126.1, 425/135, 150, 143, 397, 400, 407, 414, 412
See application file for complete search history.

(56) References Cited

U.S. PATENT DOCUMENTS

| | | | |
|---|---|---|---|
| 2,302,024 A | 11/1942 | Goss, Jr. | |
| 3,742,229 A | 6/1973 | Smith et al. | |
| 3,833,303 A | 9/1974 | Burns et al. | |
| 3,951,548 A | 4/1976 | Westell | |
| 4,037,325 A | 7/1977 | Weber et al. | |
| 4,200,395 A | 4/1980 | Smith et al. | |
| 4,211,489 A | 7/1980 | Kleinknecht et al. | |
| 4,244,683 A * | 1/1981 | Rowland | 425/385 |
| 4,287,235 A | 9/1981 | Flanders | |
| 4,310,743 A * | 1/1982 | Seliger | 219/121.12 |
| 4,450,358 A | 5/1984 | Reynolds | |
| 4,475,223 A | 10/1984 | Taniguchi et al. | |
| 4,512,848 A | 4/1985 | Deckman et al. | |
| 4,516,253 A | 5/1985 | Novak | |
| 4,543,225 A | 9/1985 | Beaujean | |
| 4,588,468 A | 5/1986 | McGinty et al. | |

(Continued)

FOREIGN PATENT DOCUMENTS

WO    WO 93/216712    10/1993

OTHER PUBLICATIONS

Kamins, T.I., "Positioning of Self-Assembled, single-crystal, germanium islands by silicon nanoimprinting" Applied Physics Letter, vol. 74, No. 12, Mar. 22, 1999.

(Continued)

*Primary Examiner*—Duane Smith
*Assistant Examiner*—Thu Khanh T. Nguyen
(74) *Attorney, Agent, or Firm*—Polster, Lieder, Woodruff & Lucchesi, LC (57) ABSTRACT

An apparatus for performing imprint lithography especially useful in creating patterns with ultrafine features on a substrate. The apparatus comprises a substrate having moldable surface carried on a first block, a mold having a molding surface carried on a second block, positioners for moving the first and second blocks relative to each other, a sensor of the relative positions of the blocks and a controller for controlling the relative positions of the blocks.

58 Claims, 9 Drawing Sheets

U.S. PATENT DOCUMENTS

| | | | |
|---|---|---|---|
| 4,592,081 A | | 5/1986 | Eaton et al. |
| 4,731,155 A | * | 3/1988 | Napoli et al. ............... 216/44 |
| 4,883,563 A | | 11/1989 | Kotani et al. |
| 5,259,926 A | | 11/1993 | Kuwabara et al. |
| 5,288,698 A | * | 2/1994 | Banjo et al. ............... 425/135 |
| 5,300,169 A | * | 4/1994 | Tahara ..................... 156/230 |
| 5,338,396 A | | 8/1994 | Abdala et al. |
| 5,425,848 A | | 6/1995 | Haisma et al. |
| 5,434,107 A | | 7/1995 | Paranjpe |
| 5,471,455 A | | 11/1995 | Jabr |
| 5,503,963 A | | 4/1996 | Bifano |
| 5,512,131 A | * | 4/1996 | Kumar et al. ............... 438/738 |
| 5,638,355 A | | 6/1997 | Jabr |
| 6,010,609 A | * | 1/2000 | Mimura et al. ............. 205/70 |
| 6,376,833 B1 | * | 4/2002 | Shimada et al. ............ 250/234 |

OTHER PUBLICATIONS

Wang, J., et al., "Fabrication of a new broadband waveguide polarizer with a double-layer 190 nm period metal-gratings using nanoimprint lithography" J. Vac. Sci. Technol. B 17 (6) Nov./Dec. 1999.

Tan, H., et al., "Roller Nanoimprint Lithography" Vac. Sci. Technol. B 16 (6) Nov./Dec. 1998.

Feynman, Richard, "There's Plenty of Room at the Bottom-An Invitation to Enter a New Field of Physics" talk delivered at the annual meeting of the American Physical Society at the California Institute of Technology (Caltech)in 1959, published in Feb. 1960 issue of Caltech's "Engineering and Science".

Flanders, D.C., "X-ray Lithography at~ 100 A linewidths using x-ray masks fabricated by shadowing techniques" Journal of Vacuum Science and Technology, 16 (6), Nov./Dec. 1979 (received Jun. 11, 1979), pp. 1615 to 1619, published American Vacuum Society, USA.

Jorritsma et al., "Fabrication of Large arrays of metallic nanowires on V-grooved substrates" Applied Physics Letters 67 (10), Sep. 4, 1995 (received May 16, 1995), pp. 1489-1491, published by American Institute of Physics, USA.

Aumiller et al., "Submicrometer Resolution Replication of Relief Patterns for Integrated Optics", J. Appl. Phys., vol. 45, pp. 4557-4562, (1974).

Nisper, "Injection-molded replication of binary optic structures", SPIE v2600 Oct. 23-24, 1995 p. 56-64 0227-786X.

Shvartsman, "Holographic optical elements by dry photopolymer embossing" SPIE (1991) 1461 (pract. Holog. S) pp. 313-320.

"Fabrication of submicron crossed square wave grating by dry etching and thermoplastic replication techniques" JVST B vol. 1, No. 4, Dec. 1983, pp. 1207-1210.

Healey et al., "Photodepostition of Micrometer-scale polymer patterns on optical imaging Fibers" Science vol. 269, Aug. 1995, pp. 1078-1080.

\* cited by examiner

LITHOGRAPHIC APPARATUS FOR MOLDING ULTRAFINE FEATURES

CROSS REFERENCE TO RELATED APPLICATION

This application is a continuation of U.S. patent application Ser. No. 10/046,594 filed by Stephen Chou on Oct. 29, 2001, now pending, which is a divisional application to U.S. patent application Ser. No. 09/107,006 filed by Stephen Chou on Jun. 30, 1998 (now U.S. Pat. No. 6,309,580 issued Oct. 30, 2001) and which, in turn, is a continuation-in-part application to U.S. patent application Ser. No. 08/558,809 filed by Stephen Chou on Nov. 15, 1995 (now U.S. Pat. No. 5,772,905 issued Jun. 30, 1998). The foregoing '594 application, '006 application and '809 application are each incorporated herein by reference.

This application is also related to U.S. application Ser. No. 10/244,296 filed by Stephen Chou on Sep. 16, 2002, now pending, and entitled "Lithographic Method With Bonded Release Layer For Molding Small Patterns" and U.S. application Ser. No. 10/244,276 filed by Stephen Chou on Sep. 16, 2002, now pending, and entitled "Lithographic Method For Molding Pattern With Nanoscale Features" and to U.S. application Ser. No. 10/244,303 filed by Stephen Chou on Sep. 16, 2002, now pending, and entitled "Lithographic Method for Molding Pattern With Nanoscale Depth." These three related applications are incorporated herein by reference.

BACKGROUND OF THE INVENTION

1. Field of the Invention

The present invention relates to lithographic apparatus for performing imprint lithography. More specifically, it relates to lithographic apparatus particularly useful for imprinting ultrafine features in a moldable surface on a substrate.

2. Background of the Art

In many different areas of technology and commercial utility, it is highly desirable that surface be provided with non-stick functionality. The wide range of utility for this type of technology ranges from antistain treatments for fabrics and surfaces (e.g., countertops, stove tops, and the like), to utensils (e.g., cooking or laboratory utensils and surfaces), release surfaces for imaging technology (e.g., image transfer surfaces, temporary carriers), and mold release surfaces. Antistick functionality has clear lubricating implications where the antistick function can be provided in a substantive or retentive manner onto a substrate.

In the fabrication of semiconductor integrated electrical circuits, integrated optical, magnetic, mechanical circuits and microdevices, and the like, one of the key processing methods is lithography and especially photolithography. Lithography can be used, along with its traditional resist imaging in the formation of printing plates and resist images, to create a pattern in a thin film carried on a substrate so that, in subsequent process steps, the pattern can be replicated in the substrate or in another material which is added onto the substrate. The thin film which accepts a pattern or image during the lithographic process is often referred to as resist. The resist may be either a positive resist or a negative resist, depending on its operation of formation. For example, a positive photoresist becomes more soluble in a solvent where irradiated and a negative resist becomes more insoluble where irradiated. A typical lithographic process for integrated circuit fabrication involves exposing or irradiating a photoresist composition or film with a beam of radiation or particles, including light, energetic particles (which may be electrons), photons, or ions, by either passing a flood beam through a mask or scanning a focused beam. The radiation or particle beam changes the chemical structure of the exposed area of the film, so that when washed or immersed in a developer or washed with a developer, either the exposed area or the unexposed area of the resist will be removed to recreate the patterns or its obverse of the mask or the scanning. The lithography resolution is limited by the wavelength of the particles and the resolution of the beam, the particle scattering in the resist and the substrate, and the properties of the resist.

There is an ongoing need in art of lithography to produce progressively smaller pattern sizes while maintaining cost efficiency in the process. There is a great need to develop low-cost technologies for mass producing sub-50 nm structures since such a technology could have an enormous impact in many areas of engineering and science. Not only will the future of semiconductor integrated circuits be affected, but also the commercialization of many innovative electrical, optical, magnetic, mechanical microdevices that are far superior to current devices will rely on the possibility of such technology. Additionally optical materials, including reflective coatings and reflective sheeting (as may be used for security purposes or for signage) can use microreplication techniques according to lithographic technology.

Numerous technologies have been developed to service these needs, but they all suffer serious drawbacks and none of them can mass produce sub-50 nm lithography at a low cost. Electron beam lithography has demonstrated 10 nm lithography resolution. A. N. Broers, J. M. Harper, and W. W. Molzen, *Appl. Phys. Lett.* 33, 392 (1978) and P. B. Fischer and S. Y. Chou, *Appl. Phys. Lett.* 62, 2989 (1993). However, using these technologies for mass production of sub-50 nm structures seems economically impractical due to inherent low throughput in a serial processing tool. X-ray lithography, which can have a high throughput, has demonstrated 50 nm lithography resolution. K. Early, M. L. Schattenburg, and H. I. Smith, *Microelectronic Engineering* 11, 317 (1990). But X-ray lithography tools are rather expensive and its ability for mass producing sub-50 nm structures is yet to be commercially demonstrated. Lithography based on scanning probes has produced sub-10 nm structures in a very thin layer of materials. However, the practicality of such lithography as a manufacturing tool is hard to judge at this point.

Imprint technology using compressive molding of thermoplastic polymers is a low cost mass manufacturing technology and has been around for several decades. Features with sizes greater than 1 micrometers have been routinely imprinted in plastics. Compact disks which are based on imprinting of polycarbonate are one example of the commercial use of this technology. Other examples are imprinted polymethyl methacrylate (PMMA) structures with a feature size on the order to 10 micrometers for making micromechanical parts. M. Harmening, W. Bacher, P. Bley, A. El-Kholi, H. Kalb, B. Kowanz, W. Menz, A. Michel, and J. Mohr, *Proceedings IEEE Micro Electro Mechanical Systems,* 202 (1992). Molded polyester micromechanical parts with feature dimensions of several tens of microns have also been used. H. Li and S. D. Senturia, *Proceedings of 1992 13th IEEE/CHMT International Electronic Manufacturing Technology Symposium,* 145 (1992). However, no one has recognized the use of imprint technology to provide 25 nm structures with high aspect ratios. Furthermore, the possibility of developing a lithographic method that combines imprint technology and other technologies to replace the conventional lithography used in semiconductor integrated circuit manufacturing has never been raised.

SUMMARY OF THE INVENTION

The present invention relates to methods for changing the properties of surfaces by bonding coatings of molecules to surfaces to form non-continuous coatings of molecules bonded thereto. The invention is particualrly advantageous for forming mold or microreplication surfaces having coatings of molecules bonded thereto, and to processes of molding and microreplication using these coatings and surfaces. The coatings may be referred to as non-continuous coatings as the coating material does not have to bond cohesively with itself parallel to the surface which is coated, but is bonded, molecule-by-molecule, to the surface, such as grass protrudes, blade-by-blade, from the surface of the ground.

The present invention relates to a method for providing a surface with a treatment that can render the surface more effective in molding or microreplication processes. A molecular moiety having release properties towards other materials (e.g., fluorinated hydrocarbon chains or polysiloxanes) and low chemical reactivity to moldable polymers is bonded to a mold or microreplication surface. The release properties of the molecular moiety having release properties allows for the enhancement of resolution on the molded article since the molded material is released from the minute features of the mold on a molecular level. More common polymeric coated release surfaces can fill the openings or partially fill the openings of the mold. Merely smoother release surfaces expose the surface of the mold to abrasion and to reaction with the molding materials. The description of the coating as non-continuous may be described as follows. A continuous coating normally is one that forms a film on the surface with no direct route from one side of the film to the other side of the film. As there is no true film coating formed in the practice of the present invention, but rather individual molecules tend to be stacked up on the surface, there is no continuous coating, even though there may be uniform properties over the surface. On a molecular level, the surface would appear as a surface having one moiety at one end of a relatively linear molecule bonded to the surface. The relatively linear molecule extends away from the surface, with the release properties provided by the 'tail' of the molecule that extends away from the surface. The relative concentration of tails on the surface controls the hydrophilic/hydrophobic/polar/non-polar properties of the surface so that it will enable ready release of the material provided by the molding or microreplication process. The release portion of the adhered molecule will preferably have few reactive sites on the tail, particularly within the last one, two, three or four skeletal atoms in the relatively linear chain (e.g., with a hydrocarbon-based chain, the alpha, beta, gamma, and delta atoms in the chain). Such moieties to be avoided particularly would include free hydrogen containing groups (e.g., acid groups, carboxylic acid groups or salts, sulfonic acid groups or salts, amine groups, ethylenically unsaturated groups, and the like).

The present invention also relates to a method and apparatus for performing ultra-fine line lithography of the type used to produce integrated circuits and microdevices. A layer of thin film is deposited upon a surface of a substrate. A mold having its mold surface treated with the release materials of the present invention and at least one protruding feature and a recess is pressed into the thin film, therefore the thickness of the film under the protruding feature is thinner than the thickness of the film under the recess and a relief is formed in the thin film. The relief generally conforms to the shape of the feature on the mold. After the mold is removed from the film, the thin film is processed such that the thinner portion of the film in the relief is removed exposing the underlying substrate. Thus, the pattern in the mold is replicated in the thin film, completing the lithography. The patterns in the thin film will be, in subsequent processes, reproduced in the substrate or in another material that is added onto the substrate. The use of the release treatment on the mold surface enhances the resolution of the image and can protect the mold so that it can be used more often without showing wear on fine features in the mold.

The invention described here is based on a fundamentally different principle from conventional lithography. The process invention can eliminate many resolution limitations imposed in conventional lithography, such as wavelength limitation, backscattering of particles in the resist and substrate, and optical interference. It has been demonstrated the present invention can include a high throughput mass production lithography method for generating sub-25 nm features. Furthermore, the present invention has the ability to mass produce sub-10 nm features at a low cost. These capabilities of the present invention is unattainable with the prior art, and the use of the adherent release property coating improves the durability and the resolution of the process even further. The present process, however, has implications and utility for more macroscopic details in molding surfaces and would include features in the super-50 nm range, the super-100 nm range, and the super 200 nm range, as well as macroscopic dimensions in the visual range of features (e.g., 0.1 mm and greater).

DETAILED DESCRIPTION OF THE INVENTION

The present invention relates to methods for changing the properties of surfaces by bonding non-continuous coatings of molecules thereto, to surfaces having non-continuous coatings of molecules bonded thereto, to mold or microreplication surfaces having non-continuous coatings of molecules bonded thereto, and to processes of molding and microreplication using these coatings and surfaces.

This invention also relates to a method and apparatus for a high-resolution, high-throughput, low-cost lithography.

Unlike current microlithography, a preferred embodiment of the present invention abandons usage of energetic light or particle beams. Photolithography may also benefit from the practice of the present invention by the use of the reactive release layer bonded to the mold surface. In the embodiment of the invention which does not require the use of photolithography, the present invention is based on pressing a mold into a thin film on a substrate to create a relief and, later removing the compressed area of the film to expose the underlying substrate and to form a resist pattern on the substrate that replicates the obverse of the protruding pattern of the mold.

The present invention also has demonstrated the generation of patterns, such as holes, pillars, or trenches in a thin film on a substrate, that have a minimum size of 25 nm, a depth over 100 nm, a side wall smoothness better than 3 nm, and corners with near perfect 90 degrees angles. It was found that presently the size of imprinted features is limited by the size of the mold being used; with a suitable mold, the present invention should create sub-10 nm structures with a high aspect ratio. Furthermore, using one embodiment of the present invention that including a material deposition and a lift-off process, 100 nm wide metal lines of a 200 nm period and 25 nm diameter metal dots of 125 nm period have been fabricated. The resist pattern created using the present invention also has been used as a mask to etch nanostructures (features having dimensions less than 1000 nm, preferably less than 500 nm) into the substrate.

The present invention offers many unique advantages over the prior art. First, since it is based on a paradigm different from the prior art and it abandons the usage of an energetic particle beam such as photons, electrons, and ions, the present invention eliminates many factors that limit the resolution of conventional lithographies, such as wave diffraction limits due to a finite wavelength, the limits due to scattering of particles in the resist and the substrate, and interferences. Therefore the present invention offers a finer lithography resolution and much more uniform lithography over entire substrate than the prior art. Results show it can achieve sub-25 nm resolution. Second, the present invention can produce sub-25 nm features in parallel over a large area, leading to a high throughput. This seems unachievable with the prior art. And thirdly, since no sophisticated energetic particle beam generator is involved, the present invention can achieve a sub-25 nm lithography over a large area at a cost much lower than the prior art. These advantages make the present invention superior to the prior art and vital to future integrated circuit manufacturing and other areas of science and engineering where nanolithography is required.

The non-continuous coatings of molecules are formed from a specific type of reactive compound. These compounds may be characterized by the following structure:

RELEASE-M(X)$_n$ or

RELEASE-M(OR)$_n$, wherein

RELEASE is a molecular chain of from 4 to 20 atoms in length, preferably from 6 to 16 atoms in length, which molecule has either polar or non-polar properties, depending upon the phobicity desired towards a molding agent;

M is an inorganic atom, especially a metal atom, semiconductor atom, or semimetal atom;

X is halogen or cyano, especially Cl, F, or Br;

R is hydrogen, alkyl or phenyl, preferably hydrogen or alkyl of 1 to 4 carbon atoms, most preferably hydrogen, methyl or ethyl; and;

(n) is the valence −1 of M, usually 1, 2 or 3 depending upon the nature of M.

The actual moiety bonded to the surface has one of the groups bonded to the metal or semimetal atom removed during a reaction with the mold surface and may have the structural formula:

RELEASE-M(X)$_{n-1}$— or

RELEASE-M(OR)$_{n-1}$—, wherein

RELEASE is a molecular chain of from 4 to 20 atoms in length, preferably from 6 to 16 atoms in length, which molecule has either polar or non-polar properties;

M is a metal or semimetal atom;

X is halogen or cyano, especially Cl, F, or Br;

R is hydrogen, alkyl or phenyl, preferably hydrogen or alkyl of 1 to 4 carbon atoms; and;

(n) is the valence −1 of M.

As noted above, the properties of RELEASE are determined in part by the nature of the molded material to be used with the surface or the nature of the properties desired on the surface. That is where the surface is to be used in microreplication with a polar polymeric material, the RELEASE properties must be non-polar. Non-polar RELEASE groups are preferably selected, for example, from non-polar molecular units including especially siloxane units and highly fluorinated or fluorocarbon units. It is further preferred that these non-polar molecular units are linear units of from 4 to 20 skeletal atoms in the linear chain. Smaller chains might not form as continuous of release properties as desired, and longer chains might mask features on the surface to be replicated. By highly fluorinated is meant that at least ⅔ of all substituents on the carbon are fluorinated units, with the remaining units comprising Cl or H. Preferably the terminal carbon is perfluorinated, more preferably the terminal carbon atom is perfluorinated and no hydrogen atoms are present on the three terminal carbon atoms, and most preferably the chain is perfluorinated.

M is preferably a metal atom, semiconductor atom or semimetal atom such as for example, Si, Ti, Zr, Cr, Ge, and the like. Most preferably M is Si. In these cases, n would preferably be 3.

Examples of the compounds which can be used in the practice of the present invention comprise perfluorohexyl trichlorosilane, perfluorooctyl trichlorosilane, perfluorodecyl trichlorosilane, perfluorododecyl trichlorosilane, perfluorohexylpropyl trichlorosilane, perfluorodecyl trichlorotitanium, perfluorodecyl dichlorobromosilane, polydimethylsiloxane-trichlorosilane (with n preferably of about 4 to 20 for the polydimethylsiloxane unit), perfluorodecyl dichlorobromogermanium, perfluorodecyl dichlorobromochromium, and the like.

The mold surfaces to be used may be any surface to which the release providing molecules may bond. By selecting appropriate release providing molecules, substantially any release surface may be used. The release surface may be metallic, semimetallic, metal oxides, metal and semimetal carbides and nitrides, semimetallic oxide, polymeric, semiconductors, photoconductors, ceramic, glass, composite or the like, as is known in the molding and microreplication art. Particularly useful substrates include, but are not limited to, silicon, silicon nitride, silicon carbide, silicon nitride, doped semiconductor blends, photoconductors (both organic and inorganic), and the like. The molding process may include impression molding as generally described above, injection molding, powder molding, blow molding, casting or cast molding, vapor deposition molding, decomposition molding (where materials are decomposed to form new materials which deposit on the surface), and the like. Uniformly shaped patterns or random patterns may be manufactured, and the materials used in the molding composition may harden, as previously noted, by cooling thermally softened materials, polymerizable materials, chemically reacting materials, vapor depositing materials, or the like. Preferred materials comprise semiconductor, dielectric, photoresponsive, thermally responsive, or electrically responsive substrates or surfaces, such as, but not limited to, inorganic oxides (or sulfides, halides, carbides, nitrides, etc.), rare earth oxides (or sulfides, halides, carbides, nitrides, etc.), inorganic or organic silicon compounds (e.g., silica oxides, sulfides, halides, carbides, nitrides, etc.) and their titanium, germanium, cadmium, zinc and the like counterparts (e.g., titania, zinc oxide [particles or layers], germanium oxide, cadmium sulfide) as continuous or discontinuous coatings or layers, as mixture, dispersions or blends, as layered structures, and the like.

Figure 1A:
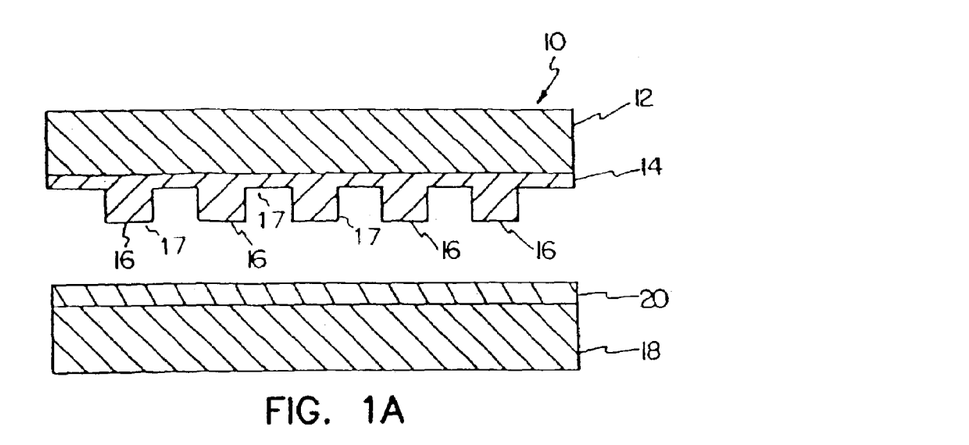
FIG. 1A is a cross sectional view showing a mold and substrate in accordance with the present invention.

The release-coating forming materials of the present invention may be applied in coatings which form less than continuous monomolecular layers of the release material. That is, the release material forms coatings comprising tails of the release moiety secured to the surface by reaction with the nominatively inorganic end of the molecule (e.g., the silicon, titanium, germanium, end). The entire surface of the substrate is not necessarily coated, as the release molecules tend to prevent other molecules from aligning uniformly (at least uniformly in a pattern) along the surface. There may be, and most likely always is, some spacing between the individual coating molecules on the surface since, as shown in FIG. 1A, the coating does not form as a continuous layer parallel to the coated surface, but rather forms as extended molecules bonded at only one end to the surface, leaving the RELEASE group outwardly extending to provide the release (non-stick) properties. However, the release moiety tail of the compounds evidences an area of lubricity, so a uniform coating is not essential. Coating weights of the release coating material may be used in surprisingly small amounts, considering their effectiveness. For example, coating weights of less than 0.001 mg/m$^2$ of surface area have provided significant release coating effects. Coating weights of 0.001 to 100 or more mg/m$^2$ of surface area, from 0.005 to 5 mg/m$^2$ of surface area, and preferably from 0.01 up to 1 to 5 mg/m$^2$ of surface area are generally useful.

FIGS. 1A–1D show steps in accordance with one embodiment. FIG. 1A shows molding layer 10 having body 12 and molding layer 14. The release coating material Si-RELEASE is shown attached to said molding layer 10, although not proportionally. The Si-RELEASE compound is shown as single molecules bonded at the Si end, with the RELEASE tail extending therefrom to provide the release properties to the mold 14. The size of the release compound residues —Si-RELEASE is molecular as opposed to the macromolecular view of the molding surface 14 shown in the FIG. 1A. The residual groups which may be attached to the Si (e.g., unreacted H, cyano, or halogen) are not shown, merely for convenience in drawing the Figure. As can be seen from this less than literal representation, the RELEASE moities extend away from the molding surface 14. These RELEASE 'tails" provide the release property and tend to be fairly durable and persistent. Molding layer 14 is shown as including a plurality of features 16 having a desired shape. A release layer 17 is shown bonded to the surface of the features 16 on the molding layer 14. A substrate 18 carries thin film layer 20. Thin film layer 20 is deposited through any appropriate technique such as spin casting, slot die coating, slide coating, curtain coating, solvent coating, gravure coating, screen coating, vapor deposition, sputtering and the like.

Figure 1B:
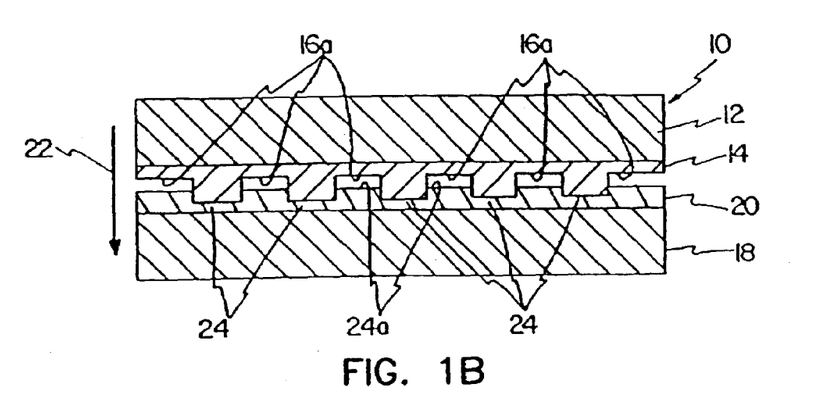
FIG. 1B is a cross sectional view of the mold and substrate of FIG. 1A showing the mold pressed into a thin film carried on the substrate.

FIG. 1B shows a compressive molding step where mold 10 is pressed into thin film layer 20 in the direction shown by arrow 22 forming compressed regions 24. In the embodiment, shown in FIGS. 1A–1D, features 16 are not pressed all of the way into thin film 20 and do not contact substrate 18. In some embodiments, top portions 24a of film 20 may contact depressed surfaces 16a of mold 10. This causes top surfaces 24a to substantially conform to the shape of surfaces 16a, for example flat. When contact occurs, this also can stop the mold move further into the thin film 20, due to a sudden increase of contact area and hence a decrease of the compressive pressure when the compressive force is constant. The release layer 17 of the present inventions improves the release of the thin film layer 20 from the features 16 of the mold 10.

Figure 1C:
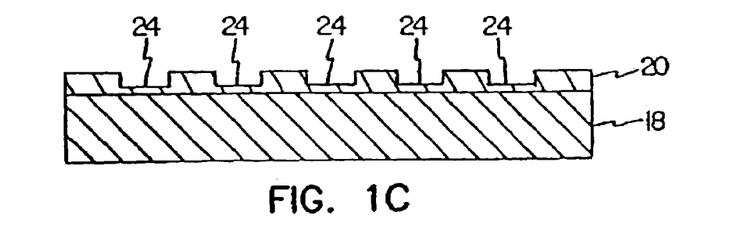
FIG. 1C is a cross sectional view of the substrate of FIG. 1B following compression of the mold into the thin film.
Figure 1D:
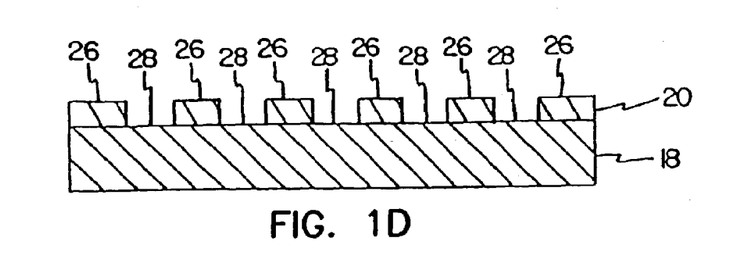
FIG. 1D is a cross sectional view of the substrate of FIG. 1C showing removal of compressed portions of the thin film to expose the underlying substrate.

FIG. 1C is a cross sectional view showing thin film layer 20 following removal of mold 10. Layer 20 includes a plurality of recesses formed at compressed regions 24 which generally conform to the shape of features 16 which is coated with release layer 17. Layer 20 is subjected to a subsequent processing step as shown in FIG. 1D, in which the compressed portions 24 of film 20 are removed thereby exposing substrate 18. This removal may be through any appropriate process such as reactive ion etching, wet chemical etching. This forms dams 26 having recesses 28 on the surface of substrate 18. Recesses 28 form relief features that conform generally to the shape of features 16 and mold 10.

The mold 10 is patterned with features 16 comprising pillars, holes and trenches with a minimum lateral feature size of 25 nm, using electron beam lithography, reactive ion etching (RIE) and other appropriate methods. The typical depth of feature 16 is from 5 nm to 200 nm (either including the dimensions of the release layer 17 or excluding those molecular dimensions), depending upon the desired lateral dimension. In general, the mold should be selected to be hard relative to the softened thin film, and can be made of metals, dielectrics, polymers, or semiconductors or ceramics or their combination. In one experiment, the mold 10 consists of a layer 14 and features 16 of silicon dioxide on a silicon substrate 12.

Thin film layer 20 may comprise a thermoplastic polymer or other thermoplastic, hardenable, or curable material which may pass from a flowable state to a non-flowing state upon a change in conditions (e.g., temperature, polymerization, curing or irradiation). During the compressive molding step shown in FIG. 1B, thin film 20 may be heated at a temperature to allow sufficient softening of the film relative to the mold. For example, above the glass transition temperature the polymer has a low viscosity and can flow, thereby conforming to the features 16 without forming a strong adherence to the surface because of the presence of the release layer 17. The film layer may comprise anything from continuous films of materials, to lightly sintered materials, to loose powders held in place by gravity until the compressive and adherent steps of the molding or microreplication processes. For example, the material could be a polymer film, latex film, viscous polymer coating, composite coating, fusible powder coating, blend of adherent and powder, lightly sintered powder, and the like. The polymer may comprise any moldable polymer, including, but not limited to (meth)acrylates (which includes acrylates and methacrylates), polycarbonates, polyvinyl resins, polyamides, polyimides, polyurethanes, polysiloxanes, polyesters (e.g., polyethyleneterephthalate, polyethylenenaphthalate), polyethers, and the like. Materials such as silica, alumina, zirconia, chromia, titania, and other metal oxides (or halides) or semimetal oxides (or halides) whether in dry form or sol form (aqueous, inorganic solvent or organic solvent) may be used as the moldable material. Composites, mixing both polymeric materials and non-polymeric materials, including microfibers and particulates, may also be used as the molding material.

In one experiment, the thin film 20 was a PMMA spun on a silicon wafer 18. The thickness of the PMMA was chosen from 50 nm to 250 nm. PMMA was chosen for several reasons. First, even though PMMA does not adhere well to the $SiO_2$ mold due to its hydrophilic surface, its adherence can be reduced further by the use of the release layers of the present invention. Good mold release properties are essential for fabricating nanoscale features. Second, shrinkage of PMMA is less than 0.5% for large changes of temperature and pressure. See I. Rubin, *Injection Molding*, (Wiley, New York) 1992. In a molding process, both the mold 10 and PMMA 20 were first heated to a temperature of 200° C. which is higher than the glass transition temperature of PMMA, 105° C. See M. Harmening, W. Bacher, P. Bley, A. El-Kholi, H. Kalb, B. Kowanz, W. Menz, A. Michel, and J. Mohr, Proceedings IEEE Micro Electro Mechanical Systems, 202 (1992). Then the mold 10 and features 16 were compressed against the thin film 20 and held there until the temperature dropped below the PMMA's glass transition temperature. Various pressures have been tested. It was found that the one preferred pressure is about 400–1900 psi., especially 500–100 psi. At that pressure, the pattern of the features 16 can be fully transferred into the PMMA, particularly when the release was expedited by the presence of the release layer 17. After removing mold 10, the PMMA in the compressed area was removed using an oxygen plasma, exposing the underlying silicon substrate and replicating the patterns of the mold over the entire thickness of the PMMA. The molding pressure is, of course, dependent upon the specific polymer being used and can therefore vary widely from material to material.

Figure 2:
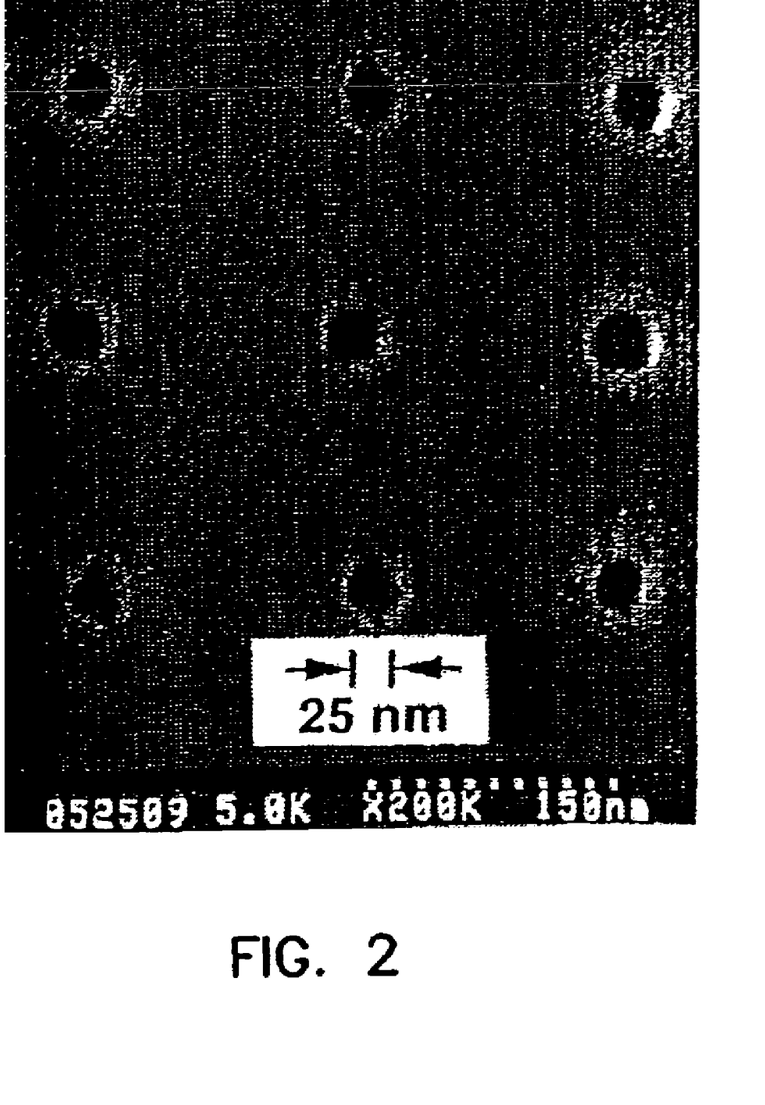

FIG. 2 in copending application Ser. No. 08/558,809 shows a scanning electron micrograph of a top view of 25 nm diameter holes with a 120 nm period formed into a PMMA film in accordance with FIG. 1C. Mold features as large as tens of microns on the same mold as the nanoscale mold features have been imprinted.

Figure 3:
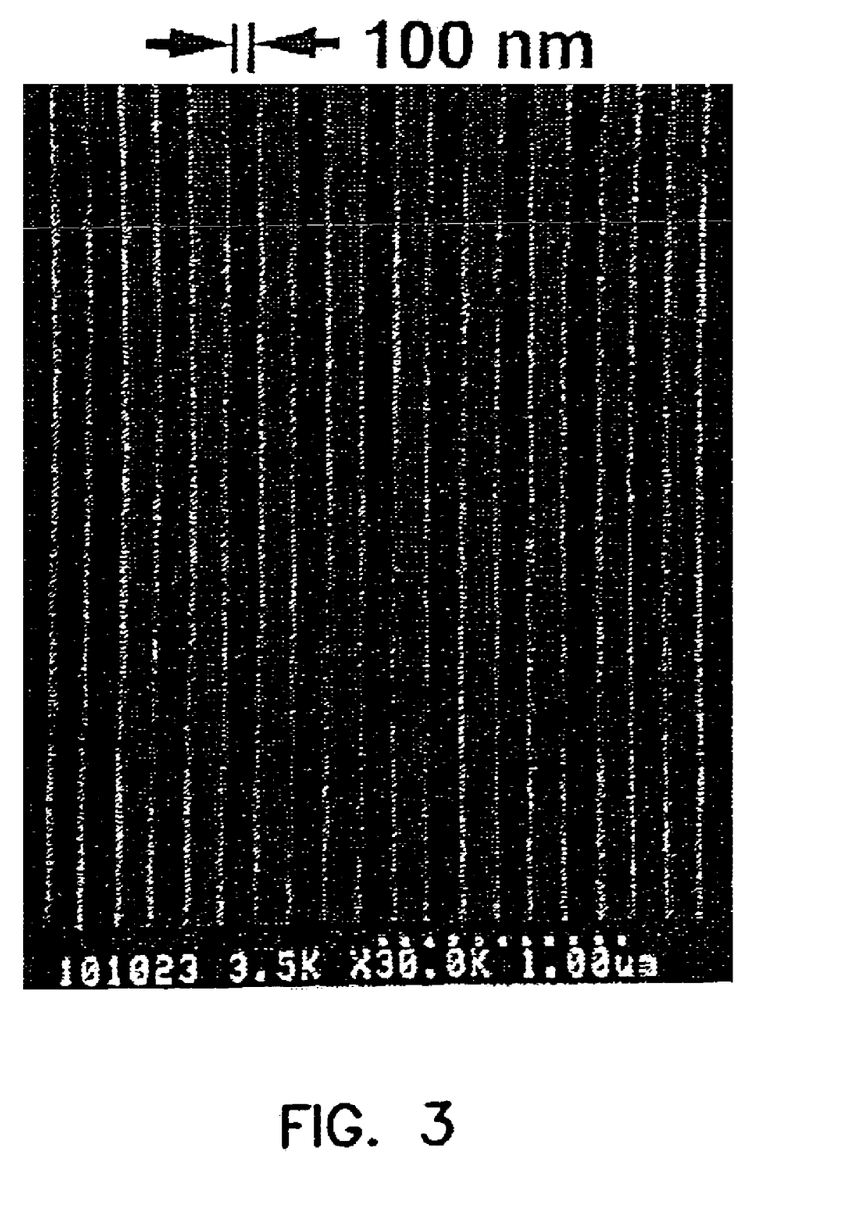

FIG. 3 copending application Ser. No. 08/558,809 shows a scanning electron micrograph of a top view of 100 nm wide trenches with a 200 nm period formed in PMMA in accordance with FIG. 1C.

Figure 4:
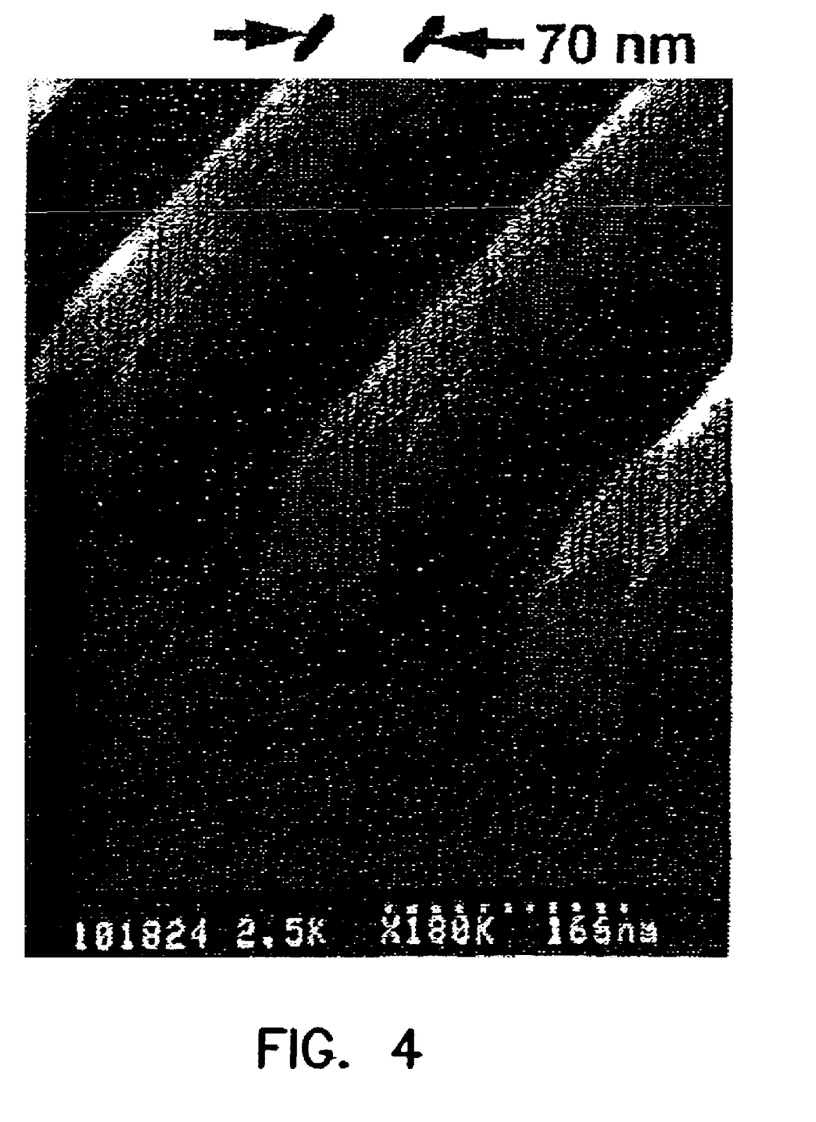

FIG. 4 in copending application Ser. No. 08/558,809 is a scanning electron micrograph of a perspective view of trenches made in the PMMA using the present invention with embodiment that top portions 24a of film 20 contact depressed surfaces 16a of mold 10. The strips are 70 nm wide, 200 nm tall, therefore a high aspect ratio. The surface of these PMMA features is extremely smooth and the roughness is less than 3 nm. The corners of the strips are nearly a perfect 90 degrees. Such smoothness, such sharp right angles, and such high aspect ratio at the 70 nm features size cannot be obtained with the prior art.

Furthermore, scanning electron microscopy of the PMMA patterns and the mold showed that the lateral feature size and the smoothness to the sidewalls of PMMA patterns fabricated using the present invention conform with the mold. From our observations, it is clear that the feature size achieved so far with the present invention is limited by our mold size. From the texture of the imprinted PMMA, it appears that 10 nm features can be fabrication with the present invention.

Figure 5A:
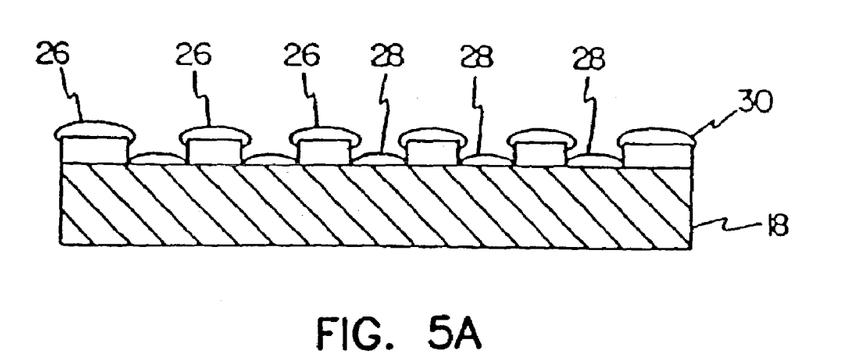
FIG. 5A is a cross sectional view of the substrate of FIG. 1D following deposition of a material.
Figure 5B:
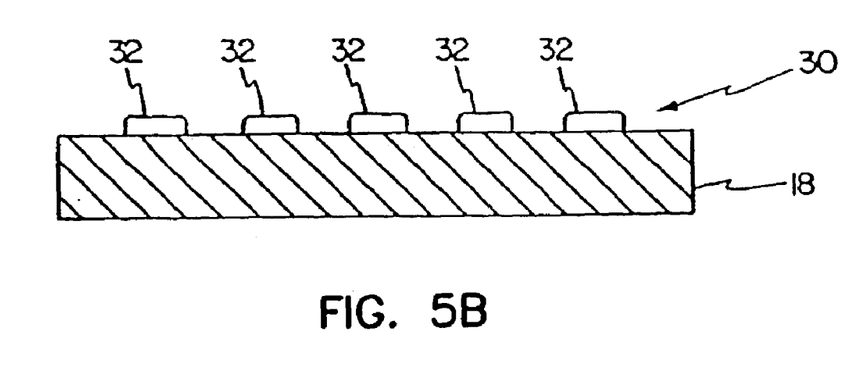
FIG. 5B is a cross sectional view of the substrate of FIG. 5A following selective removal of the material by a lift off process.

After the steps 1A–1D, the patterns in film 20 can be replicated in a material that is added on substrate 18 or can replicated directly into substrate 18. FIGS. 5A and 5B show one example of the subsequent steps which follow the steps of FIGS. 1A–1D. Following formation of the recesses 28 shown in FIG. 1D, a layer of material 30 is deposited over substrate 18 as shown in FIG. 5A. Material 30 is deposited through any desired technique over dams 26 and into recesses 28 between dams 26. Material 30 may comprise, for example, electrical conductors or semiconductors or dielectrics of the type used to fabricate integrated circuits, or it comprise ferromagnetic materials for magnetic devices. Next, a lift off process is performed in which a selective chemical etch is applied which removes dams 26 causing material 30 deposited on top of dams 26 to be removed. FIG. 5B shows the structure which results following the lift off process. A plurality of elements 32 formed of material 30 are left on the surface of substrate 18. Elements 32 are of the type used to form miniaturized devices such as integrated circuits. Subsequent processing steps similar to those shown in steps 1A–1D may be repeated to form additional layers on substrate 18.

Figure 6:
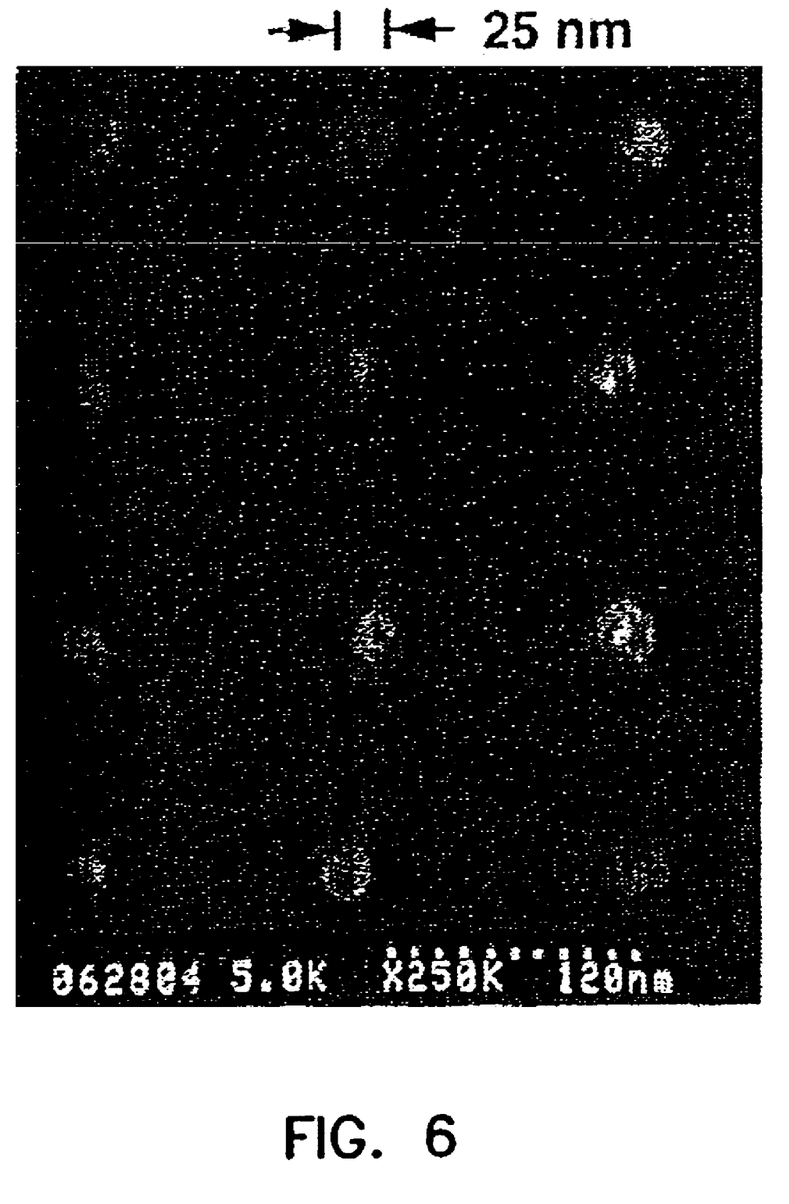

FIG. 6 of copending application Ser. No. 08/558,809 is a scanning electron micrograph of the substrate of FIG. 2 following deposition of 5 nm of titanium and 15 nm of gold and a lift off process. In the lift-off process, the wafers were soaked in acetone to dissolve the PMMA and therefore lift-off metals which were on the PMMA. The metal dots have a 25 nm diameter that is the same as that of the holes created in the PMMA using the present invention.

Figure 7:
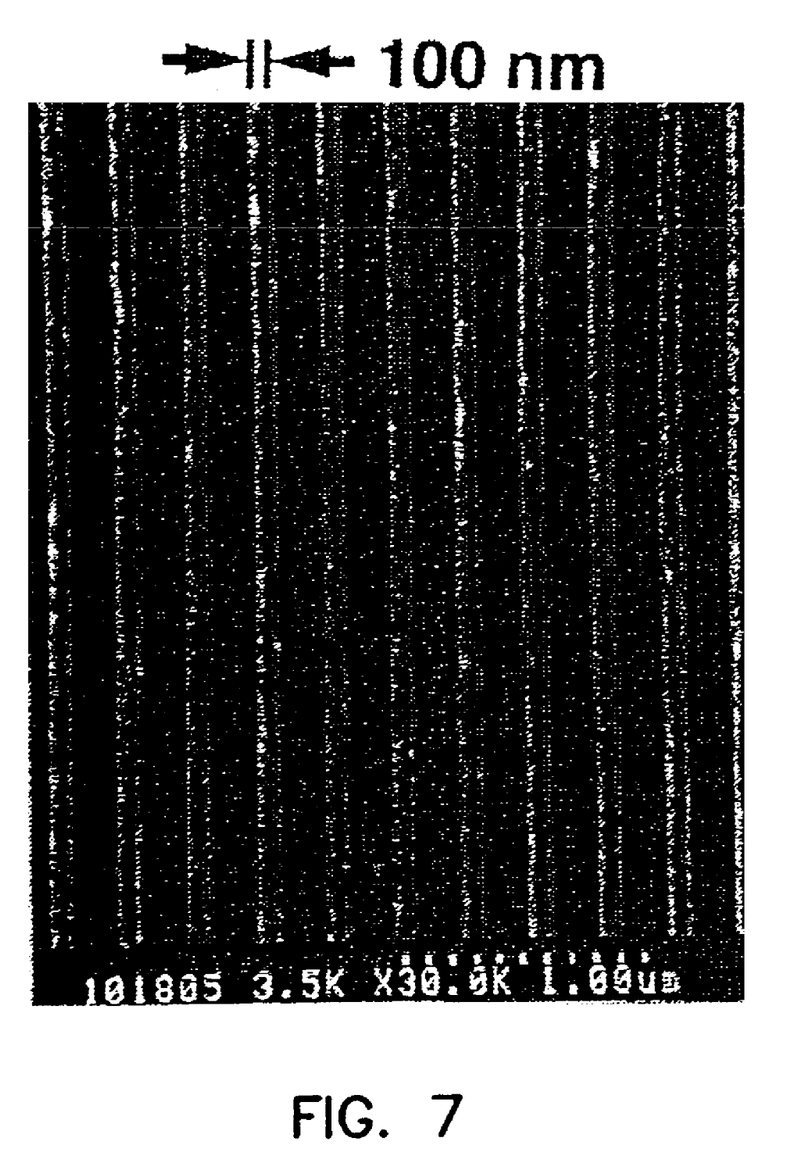

FIG. 7 of copending application Ser. No. 08/558,809 is a scanning electron micrograph of the substrate of FIG. 3 following deposition of 5 nm of titanium and 15 nm of gold and a lift off process. The metal linewidth is 100 nm that is the same as the width of the PMMA trenches shown in FIG. 3. FIGS. 6 and 7 have demonstrated that, during the oxygen RIE process in the present invention, the compressed PMMA area was completely removed and the lateral size of the PMMA features has not been changed significantly.

Figure 8:
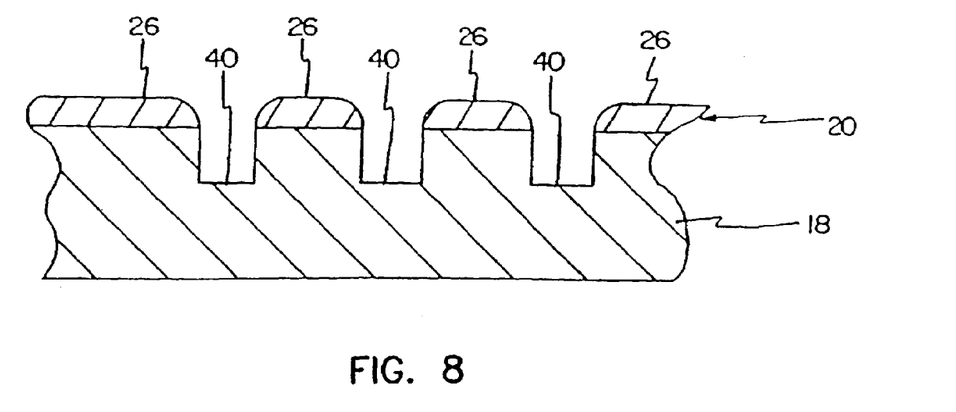
FIG. 8 is a cross sectional view of the substrate of FIG. 1D following subsequent processing.

FIG. 8 is a cross sectional view of substrate 18 of FIG. 1D following an example alternative processing step that replicates the patterns in film 20 directly into substrate 18. In FIG. 8, substrate 18 has been exposed to an etching process such as reactive ion etching, chemical etching, etc., such that recesses 40 are formed in substrate 18. These recesses 40 may be used for subsequent processing steps. For example, recesses 40 may be filled with material for use in fabricating a device. This is just one example of a subsequent processing step which can be used in conjunction with the present invention.

Molding processes typically use two plates to form malleable material therebetween. In the present invention, substrate 18 and body 12 (mold 10) act as plates for the imprint process of the invention. Substrate 18 and body 12 should be sufficiently stiff to reduce bending while forming the imprint. Such bending leads to deformation in the pattern formed in the film 20.

Figure 9:
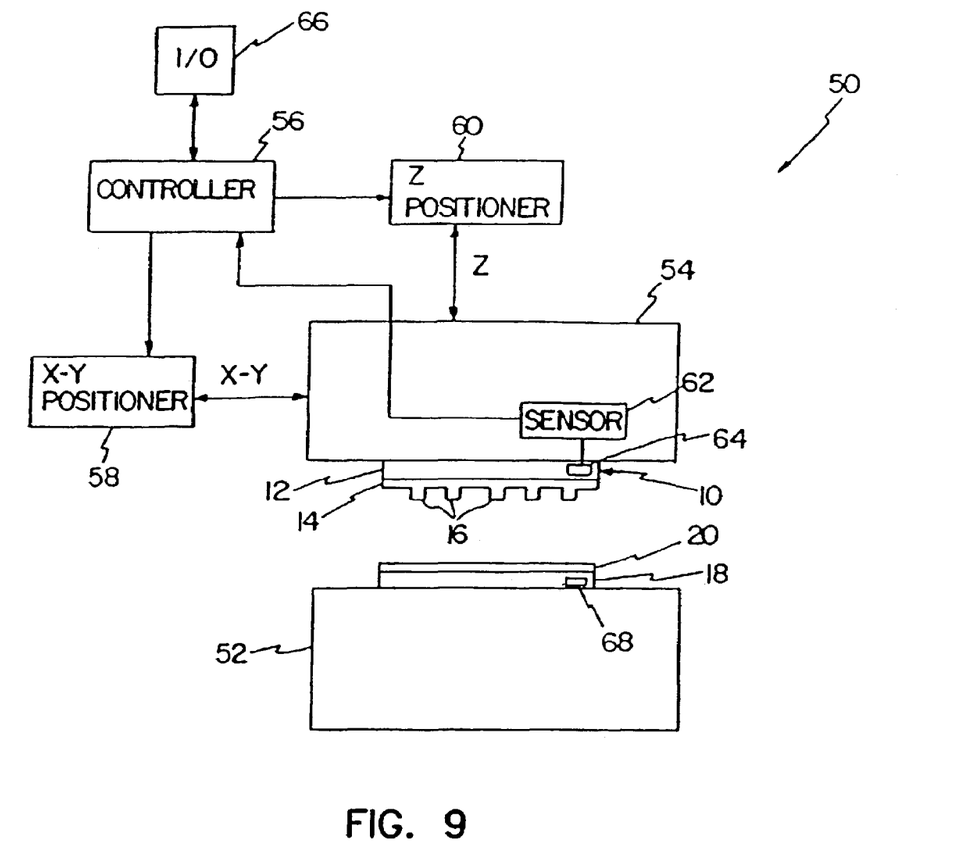
FIG. 9 is a simplified block diagram of an apparatus in accordance with one embodiment of the invention.

FIG. 9 is a simplified block diagram of apparatus 50 for performing nanoimprint lithography in accordance with the invention. Apparatus 50 includes stationary block 52 carrying substrate 18 and moveable molding block 54 carrying mold 10. Blocks 52 and 54 carry the substrate 18 and mold 10 depicted in FIGS. 1A–1D. A controller 56 couples to x-y positioner 58 and z positioner 60. An alignment mark 64 is on mold 10 and complimentary mark 68 is on substrate 18. Sensor 62 carried in block 54 couples to alignment marks 64 and 68 and provide an alignment signal to controller 56. Controller 56 is also provided with input output circuitry 66.

In operation, controller 56 controls the imprinting of mold 10 into film 20 on substrate 18 by actuating z positioner 60 which moves block 54 in the z direction relative to block 52. During the imprinting process, precise alignment of mold 10 and film 20 is crucial. This is achieved using optical or electrical alignment techniques. For example, sensor 62 and alignment marks 64 and 68 may be an optical detector and optical alignment marks which generate a moiré alignment pattern such that moiré alignment techniques may be employed to position mold 10 relative to film 20. Such techniques are described by Nomura et al. A MOIRÉ ALIGNMENT TECHNIQUE FOR MIX AND MATCH LITHOGRAPHIC SYSTEM, J. Vac. Sci. Technol. B6(1), January/February 1988, pg. 394 and by Hara et al., AN ALIGNMENT TECHNIQUE USING DEFRACTED MOIRÉ SIGNALS J. Vac. Sci, Technol. B7(6), November/December 1989, pg. 1977. Controller 56 processes this alignment information and adjusts the position of block 54 in the x-y plane relative to film 20 using x-y positioner 58. In another embodiment, alignment marks 64 and 68 comprise plates of a capacitor such that sensor 62 detects capacitance between marks 64 and 68. Using this technique, alignment is achieved by moving block 54 in the x-y plane to maximize the capacitance between alignment marks 64 and 68. During imprinting, controller 56 may also monitor and control the temperature of film 20.

It should be understood that the invention is not limited to the specific technique described herein, and may be implemented in any appropriate lithographic process. Generally, the mold should be hard relative to the film during the molding process. This may be achieved for example, by sufficiently heating the film. Additionally, it should be understood that the invention is not limited to the particular film described herein. For example, other types of films may be used. In one alternative embodiment, a thin film may be developed which has a chemical composition which changes under pressure. Thus, following the imprint process, a chemical etch could be applied to the film which selectively etches those portions whose composition had changed due to applied pressure. In anther embodiment, after molding of the thin film to create a thickness contrast in the thin film, a material is deposited on the thin film and the thickness contrast then is transferred into the substrate.

Although the present invention has been described with reference to preferred embodiments, workers skilled in the art will recognize that changes may be made in form and detail without departing from the spirit and scope of the invention.

EXAMPLES

An example of a lithographic process according to the present invention forming a pattern in a film carried on a substrate would be practiced by the steps of depositing a film on a substrate to provide a mold having a protruding feature and a recess formed thereby, the feature and the recess having a shape forming a mold pattern. At least a portion of the surface, (in this case a surface of silica or silicon-nitride is preferred) such as the protruding feature(s), if not the entire surface (the protrusions and valleys between the protrusions) onto which the film is deposited, is coated with the release material comprises a material having the formula:

RELEASE-M(X)$_{n-1}$— Formula I

RELEASE-M(X)$_{n-m-1}$Q$_m$ Formula II or

RELEASE-M(OR)$_{n-1}$— Formula III wherein

RELEASE is a molecular chain of from 4 to 20 atoms in length, preferably from 6 to 16 atoms in length, which molecule has either polar or non-polar properties;

M is a metal or semimetal atom;

X is halogen or cyano, especially Cl, F, or Br;

Q is a hydrogen or alkyl group, m is the number of Q groups,

R is hydrogen, alkyl or phenyl, preferably hydrogen or alkyl of 1 to 4 carbon atoms; and;

n-m-1 in Formula II is at least 1(m is 2 or less), preferably 2(m is 1 or less), and most preferably at least 3(m is 0)

n is the valence −1 of M.

In particular, silicon compounds (pure or in solution) of C1 to C4 alkyl (for R), wherein X is F, and RELEASE is perfluorinated alkyl are preferred. Particularly 1H, 1H, 2H, 2H-perfluorododecyltrichlorosilane (commercially available as a 97% solids solution) has been found to be particularly useful in the practice of the invention. (The triethoxysilane counterpart tends to require a more active stimulus to assure extensive bonding to the surface. The 1H, 1H, 2H, 2H-perfluorododecylmethyldichlorosilane, would close in effectiveness to the 1H, 1H, 2H, 2H-perfluorododecyltrichlorosilane, with the slightly reduced activity of the additional methyl group replacing one of the chloro groups on the silane. Similarly, the commercially available 1H, 1H, 2H, 2H-perfluorododecyldimethylmonochlorosilane would be slightly less reactive, yet again). This 1H, 1H, 2H, 2H-perfluorododecyltrichlorosilane compound is coated (in a room temperature, air tight, ventilated environment) at about 0.01 mg/m$^2$ of surface area, heated (to about 40 to 50 degrees Centigrade) to react the material to the surface, and cooled. This forms a coating on the surface in which the reactive portion of the molecule (the SiF bonds) reacts with the silica or silica nitride surface, forming a coating comprising the silicon atom bonded to the surface with a tail of the perfluorinatedalkyl group extending from the surface to leave a reduced friction surface. The mold is then urged into the film whereby the thickness of the film under the protruding feature is reduced and a thin region is formed in the film. The mold is removed from the film, processing the relief. The thin region is removed, exposing a portion of the surface of the substrate which underlies the thin region. The exposed portion of the surface of the substrate substantially replicates the mold pattern. The improvement of having at least a portion of said protruding feature and a portion of said release having the release materials of the invention bonded thereto improves the release and the resolution of the mold operation. Importantly, the release coating of the invention has been proven to be persistent and reusable, particularly where modest pressures (e.g., less than 1000 psi are used, and where the film does not contain ingredients which chemically attack the release coating. The selection of the release coating with perfluorinated R groups assists in providing chemical attack resistant coatings. It is important to note that the processes and release coated materials of the present invention can be made by the simple coating and reaction of the release coating forming materials of the present invention, and that these materials, and the broad range of equivalents are broadly enabled. The materials may be coated as pure material and allowed to react at ambient conditions (where the materials are particularly active to the surface), they may be in solution to dilute the coating (taking care to select solvents which are themselves not active to the release-coating forming compounds and preferably not to the surface), their reaction may be accelerated by heat, catalysts, initiators (either thermal, or photoinitiators, for example, such as fluorinated sulfonic acids, sulfonium or iodonium photoinitiators with complex halide anions, such as triarylsulfonium hexafluoroantimonate, diaryl iodonium tetrafluoroborate), accelerators and the like.

The release-forming coatings of the present invention may be applied as release coatings by simply applying the chemical compounds to a surface to which they react (essentially any surface with free Hydrogen atoms, which react with halogens, organic acids, silicic or inorganic acids, hydroxyl groups, hydrogen-containing amine groups, mercaptan groups, and the like). The surfaces may be polymeric surfaces, metallic surfaces, alloy surfaces, ceramic surfaces, composite surfaces, organic surfaces, inorganic surfaces, smooth surfaces, rough surfaces, textured surfaces, patterned surfaces, and the like. The use of temperatures and solvents is limited solely by their effect on the substrate and the coating. That is temperatures should not be used during the application of the surface which would degrade the surface or the coating material or so rapidly volatilize the coating material that it would not adhere. As noted elsewhere, catalysts and initiators may be used, but the preferred release coating forming compounds of the invention generally can react at room temperature without any significant stimulus being applied.

The 1H, 1H, 2H, 2H-perfluorododecyltrichlorosilane has been applied as a release surface to Si surfaces, SiN surfaces and the like solely by application of the commercially available 1H, 1H, 2H, 2H-perfluorododecyltrichlorosilane (without modification) to the surface at room temperature. The comppounds of Formula I are the most preferred (primarily because of their activity), the compounds of Formula II less preferred, and the compounds of Formula III least preferred because of their reduced reactivity to surfaces.

We claim:

1. An apparatus for performing imprint lithography on a substrate having a first alignment mark comprising:
   a mold comprising a protruding feature to be imprinted, the mold having a second alignment mark complementary to the first alignment mark;
   a first block for carrying the substrate and a second block positioned proximate the first block for carrying the mold facing the substrate;
   positioners for moving the first and second blocks relative to each other;
   a sensor coupling to the first and second alignment marks to provide an output related to the positions of the mold and the substrate; and
   a controller responsive to the sensor output for controlling the relative position of the blocks and for moving the blocks to align the first and second alignment marks.

2. The apparatus of claim 1 wherein the controller directs imprinting of the mold feature on a surface on the substrate.

3. The apparatus of claim 1 wherein the positioners comprise an x-y positioner and a z-positioner, where z is the direction between the mold and the substrate.

4. The apparatus of claim 1 wherein the controller couples to the x-y positioners and the z-positioner.

5. The apparatus of claim 1 wherein the sensor comprises an optical detector and the alignment marks are optical alignment marks.

6. The apparatus of claim 5 wherein the optical alignment marks are chosen to generate a moiré alignment pattern.

7. The apparatus of claim 1 including an element to heat or cool the surface on the substrate.

8. The apparatus of claim 7 wherein the controller monitors and controls the temperature of the surface during imprinting.

9. The apparatus of claim 1 wherein the mold comprises protruding features and recessed features for molding a pattern having a least one feature with minimum dimension of less than 200 nanometers.

10. The apparatus of claim 9 wherein the mold depth between a protruding feature of the mold and a recessed feature is less than 250 nm.

11. The apparatus of claim 10 wherein the mold depth is in the range 5–250 nm.

12. The apparatus of claim 1 wherein the mold includes a layer of release material.

13. The apparatus of claim 12 wherein the release material is bonded to the mold.

14. The apparatus of claim 1 wherein the mold comprises a pattern for molding at least one feature with a minimum dimension of less than 25 nm.

15. The apparatus of claim 1 where the mold comprises a material selected from the group consisting of metals, metal oxides, metal carbides and metal nitrides.

16. The apparatus of claim 1 wherein the mold comprises a material selected from the group consisting of semimetals, semimetal oxides, semimetal carbides and semimetal nitrides.

17. The apparatus of claim 1 wherein the mold comprises a material selected from the group consisting of polymers, semiconductors, photoconductors, ceramics and glasses.

18. The apparatus of claim 1 wherein the mold comprises a plurality of layers.

19. The apparatus of claim 9 where the mold pattern comprises a uniform pattern.

20. The apparatus of claim 9 wherein the mold pattern comprises a random pattern.

21. The appartus of claim 1 wherein the surface on the substrate comprises a polymer material.

22. The apparatus of claim 1 wherein the substrate comprises a material selected from the group consisting of silicon, silicon nitride, and silicon carbide.

23. The apparatus of claim 1 wherein the substrate comprises a material selected from the group consisting of doped semiconductor blends, organic photoconductors and inorganic photoconductors.

24. The apparatus of claim 1 wherein the surface on the substrate comprises a molding composition that hardens by a process selected from the group consisting of cooling, polymerizing, chemically reacting, and irradiating.

25. The apparatus of claim 1 wherein the surface on the substrate comprises a hardenable material selected from the group consisting of semiconductors, dielectric materials, photoresponsive materials, thermally responsive materials and electrically responsive materials.

26. The apparatus of claim 1 wherein the surface on the substrate comprises a material selected from the group consisting of inorganic oxides, sulfides, halides, carbides and nitrides.

27. The apparatus of claim 1 wherein the surface on the substrate comprises a material selected from the group consisting of rare earth oxides, sulfides, halides, carbides and nitrides.

28. The apparatus of claim 1 wherein the surface on the substrate comprises a material selected from the group consisting of silicon compounds, cadmium compounds and zinc compounds.

29. The apparatus of claim 1 wherein the surface on the substrate comprises a continuous coating or layer.

30. The apparatus of claim 1 wherein the surface on the substrate comprises a discontinuous coating or layer.

31. The apparatus of claim 1 wherein the surface on the substrate comprises a mixture, dispersion or blend.

32. The apparatus of claim 1 wherein the surface on the substrate comprises a plurality of layers.

33. The apparatus of claim 1 wherein the surface on the substrate comprises a thermoplastic material.

34. The apparatus of claim 1 wherein the surface on the substrate comprises a hardenable or curable material.

35. The apparatus of claim 1 wherein the surface on the substrate comprises a material which passes from a flowable state to a non-flowing state.

36. The apparatus of claim 1 wherein the surface on the substrate comprises a material which passes from a flowable state to a non-flowing state upon a change in temperature, polymerization, curing or radiation.

37. The apparatus of claim 1 wherein the surface on the substrate comprises a polymer having a glass transition temperature and the moldable surface is heated to a temperature above the glass transition temperature to flow into conformation with the features of the mold.

38. The apparatus of claim 1 wherein the surface on the substrate comprises a sintered material.

39. The apparatus of claim 1 wherein the surface on the substrate comprises powder.

40. The apparatus of claim 1 wherein the surface on the substrate comprises a moldable polymer selected from the group consisting of acrylates, methacrylates, polycarbonates, polyvinyl resins, polyamides, polyurethanes, polysiloxanes, polyesters and polyethers.

41. The apparatus of claim 1 wherein the surface on the substrate comprises a sol.

42. The apparatus of claim 1 wherein the surface on the substrate comprises a composite of a polymeric material and a non-polymeric material.

43. The apparatus of claim 1 wherein the substrate and the mold act as plates for urging the mold into the surface on the substrate.

44. The apparatus of claim 1 wherein at least a portion of a protruding feature of the mold has bonded thereto a release material comprising an inorganic linking group bonded to a molecular chain having release properties.

45. An apparatus for performing imprint lithography comprising:
 a substrate having a moldable surface carried on a first block; a second block positioned proximate to the first block;
 a mold carried on the second block, the mold facing the film and having a molding surface having a protruding feature;
 positioners for moving the first and second blocks relative to each other;
 a sensor providing an output related to the relative positions of the first and second blocks, wherein the mold includes an alignment mark and the substrate includes a complementary alignment mark, the alignment marks comprising plates of a capacitor, and the sensor detects the capacitance between the alignment marks; and
 a controller coupled to the positioners for precisely controlling the relative position of the blocks and moving the blocks toward each other to imprint the feature of the mold into the moldable surface.

46. The apparatus of claim 45, wherein the mold and the substrate are aligned by maximizing the capacitance between the alignment marks.

47. An apparatus for performing imprint lithography on a substrate comprising:
 a mold having protruding features for imprinting a pattern having at least one feature with a minimum lateral dimension less than 200 nanometers;
 a first block for carrying the substrate and a second block for carrying the mold facing the substrate;
 means for controlling the relative position of the blocks; and
 means for moving the blocks toward each other to imprint the pattern of the mold on a surface of the substrate at a position related to the alignment of the marks.

48. The apparatus of claim 47 wherein the protruding features are configured to imprint a pattern having at least one feature with a mold depth of less than 250 nanometers.

49. The apparatus of claim 47 wherein the protruding features are configured to imprint a pattern having at least one feature with a minimum lateral dimension less than 50 nanometers.

50. The apparatus of claim 47 wherein the protruding features are configured to imprint a pattern having at least one feature with a minimum lateral dimension less than 25 nanometers.

51. The apparatus of claim 47 further comprising alignment marks disposed on the mold and on the substrate.

52. The apparatus of claim 51 wherein the alignment marks comprise the plates of a capacitor and the means for controlling the position of the blocks comprise the sensor that detects the capacitance between the alignment marks.

53. The apparatus of claim 47 wherein the mold comprises a layer of release material bonded to the mold surface.

54. The apparatus of claim 47 wherein at least a portion of protruding features on the mold have bonded thereto a release material comprising an inorganic linking group bonded to a molecular chain having release properties.

55. The apparatus of claim 47 wherein the surface on the substrate comprises a polymer.

56. The apparatus of claim 47 wherein the substrate comprises a semiconductor.

57. The apparatus of claim 1 wherein the controller controls movement of the blocks toward each other to imprint the feature of the mold on a surface on the substrate.

58. The apparatus of claim 57 wherein the controller controls movement of the blocks to separate the mold from the surface after imprinting.

* * * * *